US012581872B2

(12) United States Patent
Miglio

(10) Patent No.: US 12,581,872 B2
(45) Date of Patent: Mar. 17, 2026

(54) METHOD FOR PRODUCING A FREESTANDING AND STRESS-FREE EPITAXIAL LAYER STARTING FROM A DISPOSABLE SUBSTRATE PATTERENED IN ETCHED PILLAR ARRAY

(71) Applicant: PILEGROWTH TECH S.R.L., Baranzate (IT)

(72) Inventor: Leonida Miglio, Domaso (IT)

(73) Assignee: PILEGROWTH TECH S.R.L., Baranzate (IT)

( * ) Notice: Subject to any disclaimer, the term of this patent is extended or adjusted under 35 U.S.C. 154(b) by 397 days.

(21) Appl. No.: 18/034,824

(22) PCT Filed: Oct. 18, 2021

(86) PCT No.: PCT/IB2021/059560
§ 371 (c)(1),
(2) Date: May 1, 2023

(87) PCT Pub. No.: WO2022/096972
PCT Pub. Date: May 12, 2022

(65) Prior Publication Data
US 2023/0420252 A1　Dec. 28, 2023

(30) Foreign Application Priority Data

Nov. 5, 2020　(IT) ........................ 102020000026356

(51) Int. Cl.
*H01L 21/02* (2006.01)
*H01L 21/304* (2006.01)
(Continued)

(52) U.S. Cl.
CPC ...... *H01L 21/02645* (2013.01); *H01L 21/304* (2013.01); *H01L 21/30604* (2013.01);
(Continued)

(58) Field of Classification Search
CPC ............ H01L 21/02645; H01L 21/304; H01L 21/30604; H01L 21/3065; H01L 21/02381;
(Continued)

(56) References Cited

U.S. PATENT DOCUMENTS 10,153,207 B2　12/2018　Frisina
2002/0111044 A1*　8/2002　Linthicum ........ H01L 21/02658
438/797
(Continued)

FOREIGN PATENT DOCUMENTS

KR　1020010085442　9/2001
KR　1020130075731　7/2013
(Continued)

OTHER PUBLICATIONS

English translation of KR-20150118517 (Year: 2015).*
(Continued)

*Primary Examiner* — William B Partridge
*Assistant Examiner* — David Paul Sedorook
(74) *Attorney, Agent, or Firm* — Dickinson Wright PLLC; Andrew D. Dorisio; Nicholas P. Coleman

(57) ABSTRACT

The method provides for the growth of an epitaxial layer (200) made of a first semiconductor material on a substrate (100) made of a second semiconductor material; the materials are different and have different CTEs; the method comprises the steps of: A) patterning the substrate (100) by an etching process so to form an array of pillars (110), the pillars (110) being laterally spaced from each other and having a top section (112) larger than a bottom section (114) and/or intermediate sections (116), B) depositing the second semiconductor material on top of the pillars (110) at a growth temperature so to form an epitaxial layer (200) generated by vertical and lateral growth, and C) inducing
(Continued)

Figures 2E, 2F, 2G, 2H:
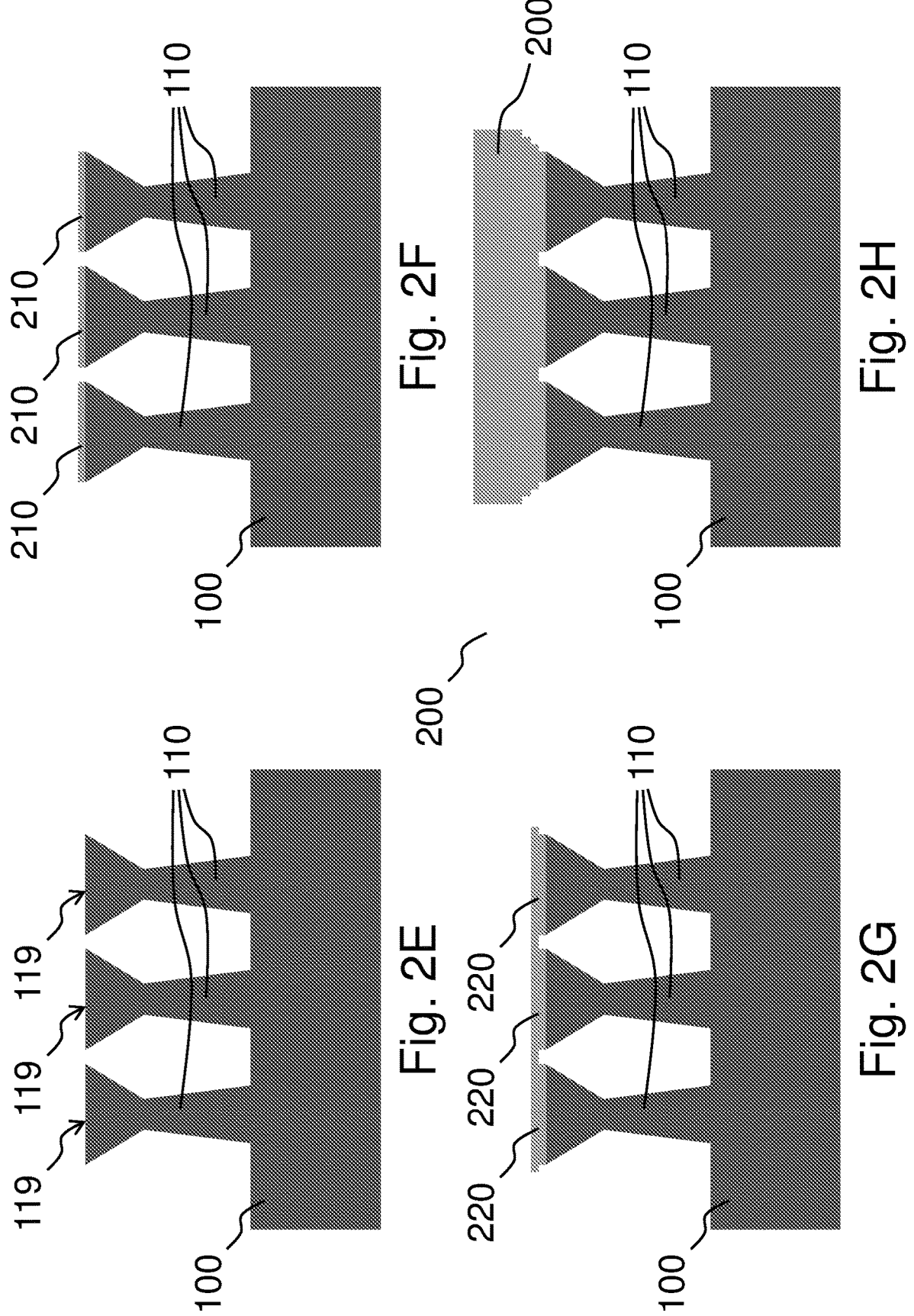

breaking of the pillars (110) by cooling the substrate (100) and the epitaxial layer (200) below the growth temperature.

14 Claims, 7 Drawing Sheets

(51) Int. Cl.
    *H01L 21/306*       (2006.01)
    *H01L 21/3065*     (2006.01)

(52) U.S. Cl.
    CPC .... *H01L 21/3065* (2013.01); *H01L 21/02381*
        (2013.01); *H01L 21/02529* (2013.01)

(58) Field of Classification Search
    CPC ......... H01L 21/02529; H01L 21/02002; H01L
               21/0243; H01L 21/02639; H01L
               21/02647; H01L 21/02664
    See application file for complete search history.

(56) References Cited

U.S. PATENT DOCUMENTS

| | | | | |
|---|---|---|---|---|
| 2008/0242096 A1* | 10/2008 | Hsu | ........................ | H10D 1/047 |
| | | | | 257/E21.396 |
| 2009/0098343 A1* | 4/2009 | Arena | ............... | H01L 21/02458 |
| | | | | 257/E21.04 |
| 2012/0231568 A1* | 9/2012 | Shibata | ............. | H01L 21/02664 |
| | | | | 438/47 |

| | | | | |
|---|---|---|---|---|
| 2015/0295085 A1* | 10/2015 | Yu | ........................... | H10D 62/10 |
| | | | | 438/197 |
| 2016/0087141 A1* | 3/2016 | Kumar | ............. | H01L 21/02002 |
| | | | | 438/480 |
| 2019/0273139 A1 | 9/2019 | Horikiri | | |
| 2020/0047114 A1* | 2/2020 | Al-Maythalony | ........................... | |
| | | | | B01D 69/1071 |
| 2020/0066618 A1* | 2/2020 | Mortan | ............. | H01L 23/49544 |
| 2021/0195734 A1* | 6/2021 | Ang | ..................... | H05K 1/0298 |

FOREIGN PATENT DOCUMENTS

| | | | | |
|---|---|---|---|---|
| KR | 20150118517 A | * | 10/2015 | ....... H01L 21/26513 |
| KR | 1020150118517 | | 10/2015 | |
| WO | 2017186810 A1 | | 11/2017 | |

OTHER PUBLICATIONS

Journal of Electronic Materials, Nov. 6, 1995; Fei Ren, Ph.D; Paul Menchhofer; James Kiggans; Hsin Wang, PhD; Temple University, Philadelphia, PA.; vol. 24, pp. 757-760.

Applied Physics Letters, Substrate-emitting ring interband cascade lasers, Oct. 26, 2017; Martin Holzbauer; Rolf Szedlak; Hermann Detz; . . . et al; vol. 111, 171101.

Solar Energy Materials and Solar Cells, Apr. 2015; Hariharsudan Sivaramakrishnan; Radhakrishnan; Roberto Martini; Valerie Depauw; . . . et al.; vol. 135, pp. 113-123.

Solar Energy Materials and Solar Cells, Dec. 2018; Hariharsudan Sivaramakrishnan Radhakrishnan; Jinyoun Cho; Twan Bearda, Julius Roth, Valerie Depauw; . . . et al.; vol. 203, 110108.

\* cited by examiner

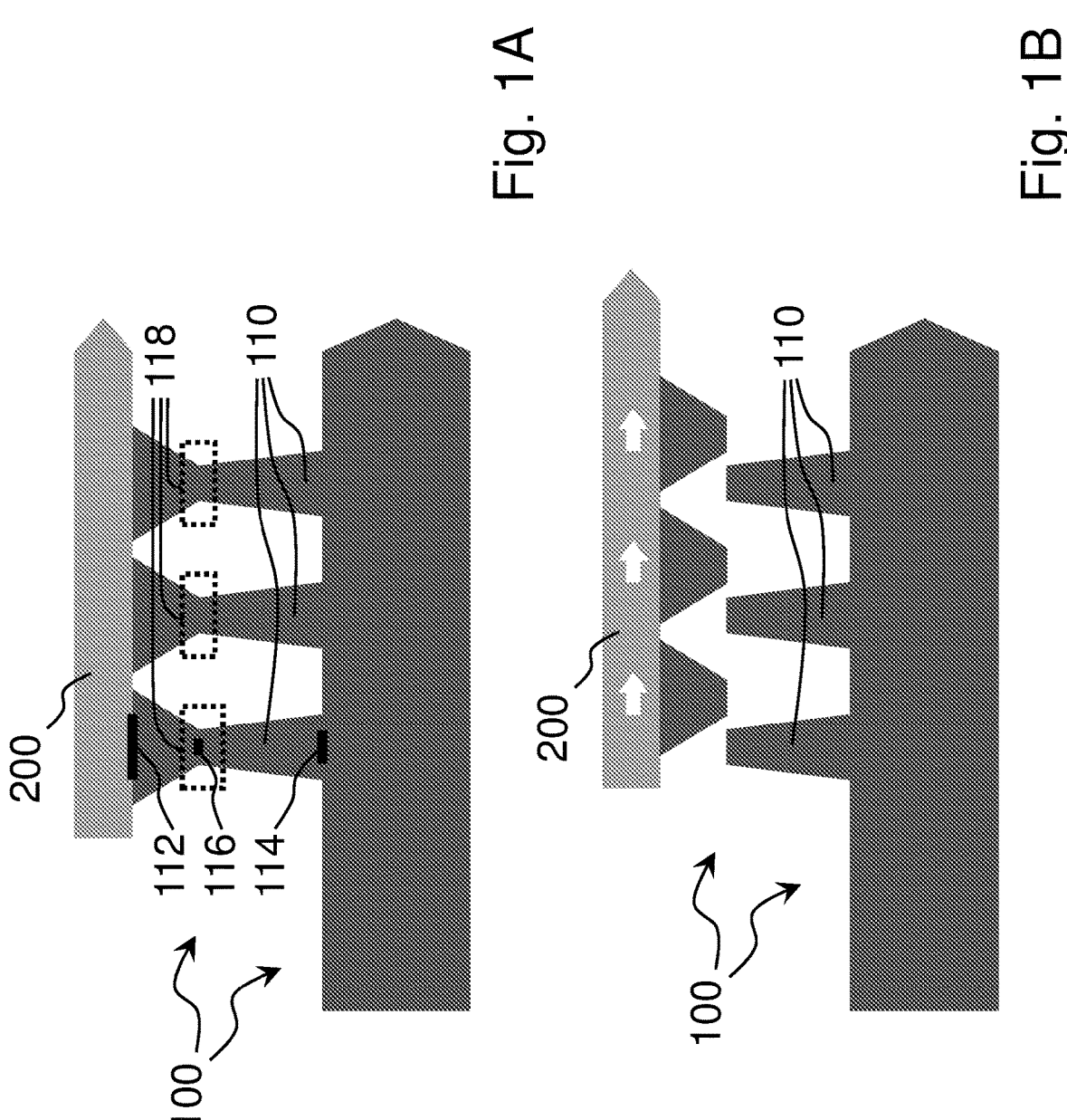

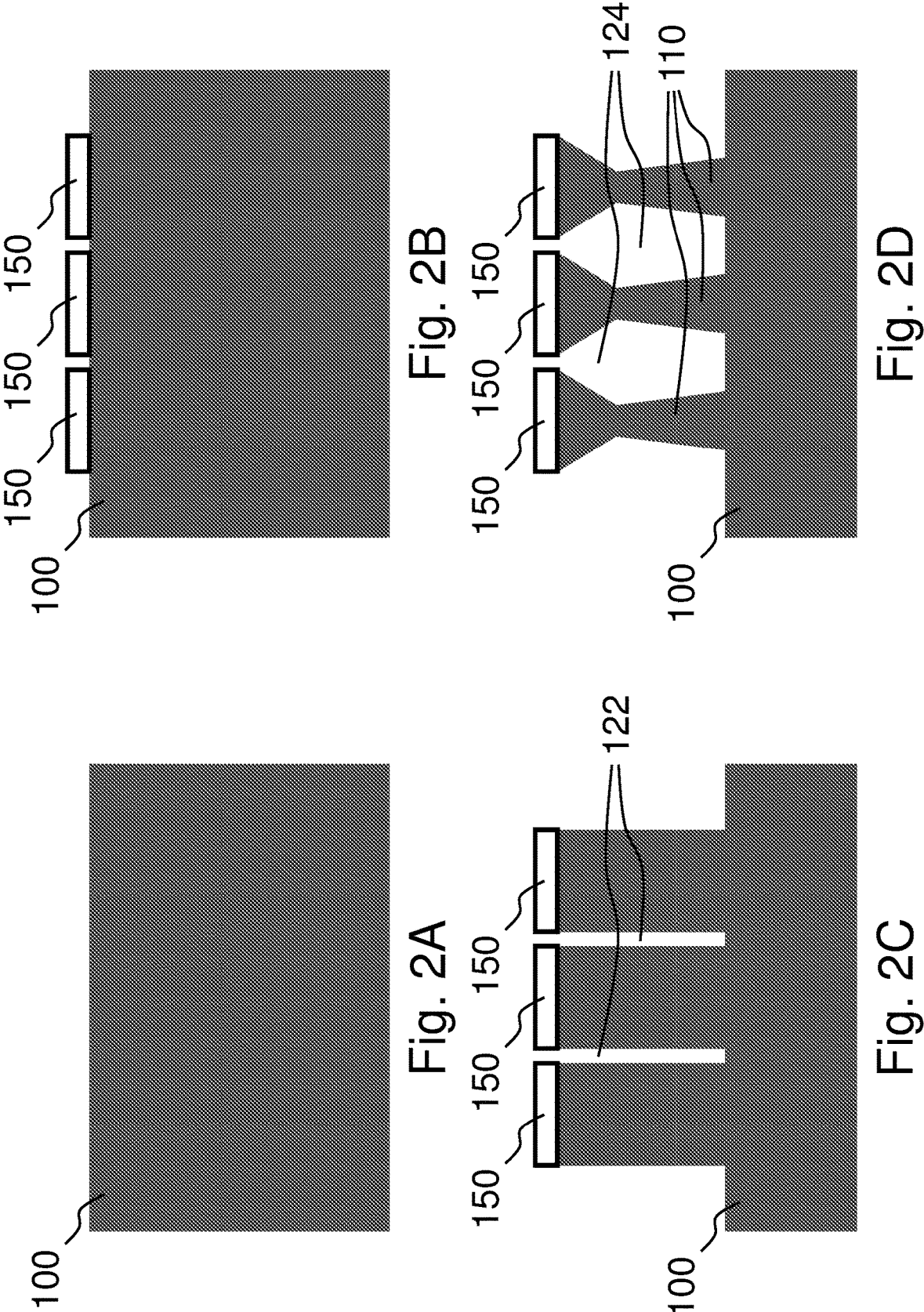

METHOD FOR PRODUCING A FREESTANDING AND STRESS-FREE EPITAXIAL LAYER STARTING FROM A DISPOSABLE SUBSTRATE PATTERENED IN ETCHED PILLAR ARRAY

FIELD OF THE INVENTION

The present invention relates to a method for producing a freestanding epitaxial layer starting from a disposable substrate; structures formed through such method, in particular a freestanding epitaxial layer to be used as a substrate for fabricating electric or electronic or optoelectronic components, are also disclosed herein.

STATE OF THE ART

The production of a substrate for fabricating electric or electronic or optoelectronic components is a very important step in a microelectronic technology, as the quality of functional film deposited on the substrate, that is the core of the components, depends strongly on the properties of the substrate. The epitaxial growth of materials having a different thermal expansion coefficient (thermal misfit) with respect to the substrate results in a detrimental bowing, or extended cracking of the wafer, during the cooling down process due to the thermal stress accumulated in the film, in turn generated by the different contraction of the film in comparison to the substrate. Heteroepitaxy is still very popular since cheap substrates like silicon substrates provide a starting seed for epitaxial phases of functional materials, not only for economic reasons, but also because it is the best way to induce a peculiar crystalline phase (for instance, cubic 3C—SiC on Si). Suitable orientation of the wafer surface is required to match the crystal phase of the epitaxial film, or to orient the growth front of the film in such a way that the density of extended defects is reduced: for instance, it is likely that Si(111) is suitable to reduce antiphase domains and staking faults in cubic 3C—SiC. Still, for reasons related to the combination of the elastic constants in the mechanical properties of this material and the lower density of mobile extended defects, such orientation results in larger thermal stresses, producing larger bowing and extended cracking, even at modest film thickness. Cubic 3C—SiC cannot be deposited on planar Si(111) substrates beyond one micron in film thickness, without producing extended cracks. Such a small thickness is not suitable for any power device manufacturing, not only for bare geometric reasons, but also because the quality of the top functional part of the film, particularly the one interesting for electric, electronic and optoelectronic components, is usually known to improve with film thickness, as due to mutual defect annihilation.

In a previous patent application (WO2017186810A1—now issued in the USA as U.S. Pat. No. 10,734,226 B2) and subsequent scientific papers from the Inventor, it was addressed how the pattering of the substrate in micrometric pillar arrays of delimited areas can accommodate the different contraction of the film with respect to the substrate, by exploiting the lateral bending of the pillars. Such a compliance mechanism is effective if the aspect ratio of the pillars is quantitatively tailored with respect to the lateral size of the array, resulting in a continuous film patch deposited on pillars, at reduced bowing and no craks. The substrate wafer can, therefore, be patterned in several separated arrays, with suitable geometry, pillar pitch and array separation, so that the total wafer surface is covered by film patches of 10-20 micrometers in thickness, at reduced bowing and no cracks. In the case of cubic 3C—SiC on Si (111), for instance, the thickness of the film patches, as large as 500 micrometers, can be even 20 micrometers, with much reduced bowing and no cracks. This is particularly useful in case the film is still integrated on the substrate, suitable for any application requiring both SiC and Si, as for example a power device in 3C—SiC connected and driven by a logic transistor on the Si side.

However, the Inventor has considered that if a freestanding wafer of the deposited film is needed for any stand-alone application, or if freestanding layers of the deposited film of the lateral size of some centimeters are required, the film thickness should be some hundreds micrometers and the substrate can be disposed.

In a recent patent assigned to STMicroelectronics (U.S. Pat. No. 10,153,207) this is accomplished by epitaxially growing an e.g. SiC film on a planar e.g. Si substate at sufficiently high temperature, so that the substrate melts before the growth is completed. Such a process works in case the melting temperature of the substrate is sensibly lower than the one of film and the growth kinetics of the deposited film is suitable at such elevated temperatures. This seems to be the case for SiC on Si. Still, apart from the above limitations in the substrate properties and in the film ones, the melting of the substrate in the growing chamber requires a peculiar design of the susceptor and of the additional systems to trap the melted silicon. In the recent scientific literature, the methods to provide the lift-off of a ultrathin film from a substrate (particularly addressing the case of multiple junction solar cell production) can be classified into two mainstreams: one is to deposit a sacrificial layer between the film and the substrate, which is eventually removed by wet etching, possibly in combination with additional process conditions (see for example, Journal of Electronic Materials, vol. 24, No. 6, (1995) 757-760, and Applied Physics Letters, vol. 111, (2017) 233509), the other one is to produce a porous silicon layer at the top of the substrate, possibly in conjunction with a thermal treatment, and eventually removing the film deposited on it by mechanical action such as rolling (see for example, Solar Energy Materials and Solar Cells vol. 135, (2015) 113-123, and Solar Energy Materials and Solar Cells, vol. 203, (2019) 110108, or Joule, vol. 3, (2019) 1782-1793).

Still, apart from the complexity of the methods, the different aims (including re-using the substrate), the Inventor has considered that no one of them relies for the lift-off process just on the spontaneous action of the thermal stress in the unavoidable cooling down step, with no chemical action, and no (or nearly no) mechanical action which would be very advantageous as explained in the following.

SUMMARY

Therefore, there is a need to improve the prior-art methods for producing substrates to be used for fabricating electric or electronic or optoelectronic components.

The general purpose of the present invention is to satisfy such need.

This general purpose and more specific purposes are accomplished thanks to what is set out in the annexed claims that forms an integral part of the present description.

A first basic idea of the present invention is to produce a freestanding epitaxial layer starting from a substrate to be disposed.

A second basic idea of the present invention is to use different semiconductor materials for the substrate and for the epitaxial layer.

A third basic idea of the present invention is to separate the epitaxial layer from the substrate without (or substantially without) a mechanical and/or chemical post-processing step. According to the invention, the separation derives (only or mainly) from the cooling of the produced structure; in particular such cooling induces breaking due to different shrinkage of distinct parts of the produced structure.

A fourth basic idea of the present invention is to grow the epitaxial layer on an array of pillars, in particular pillars derived from patterning the substrate.

Advantageously, the pillars are shaped and sized so that they break at a same (or about a same) position, specifically at a same (or about a same) depth from a top surface of the substrate wherein the pillars are etched.

Advantageously, the production method is such that the deposited epitaxial layer is not bound (or substantially not bound) laterally so that when the pillars are broken the layer is free from the substrate. In particular, this may be achieved in two ways: either the deposited layer is surrounded by free space or the deposited layer is surrounded by an element or elements of different material that does not adhere to the material of the epitaxial layer.

LIST OF FIGURES

Figure 3:
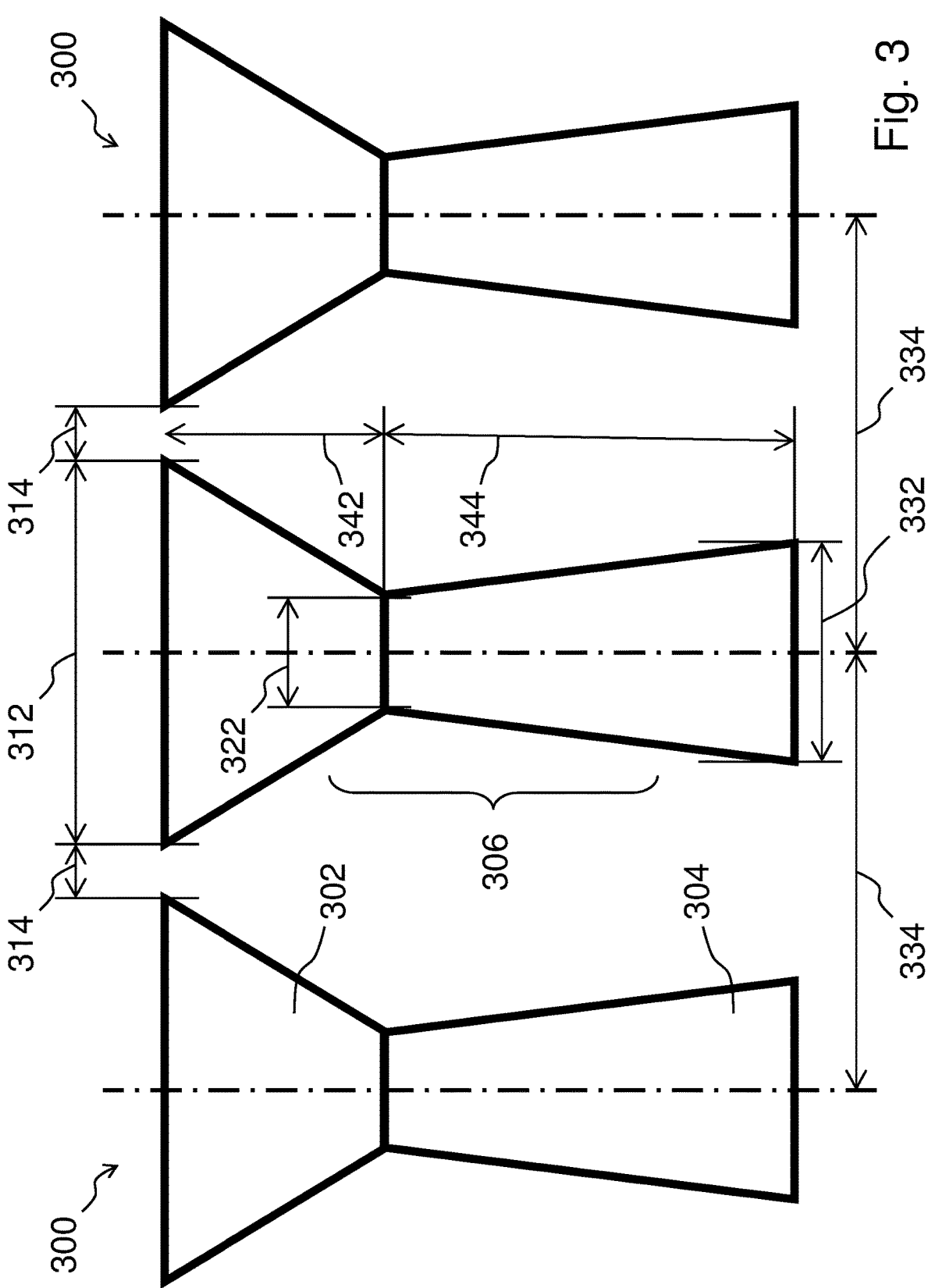
Figures 4, 5:
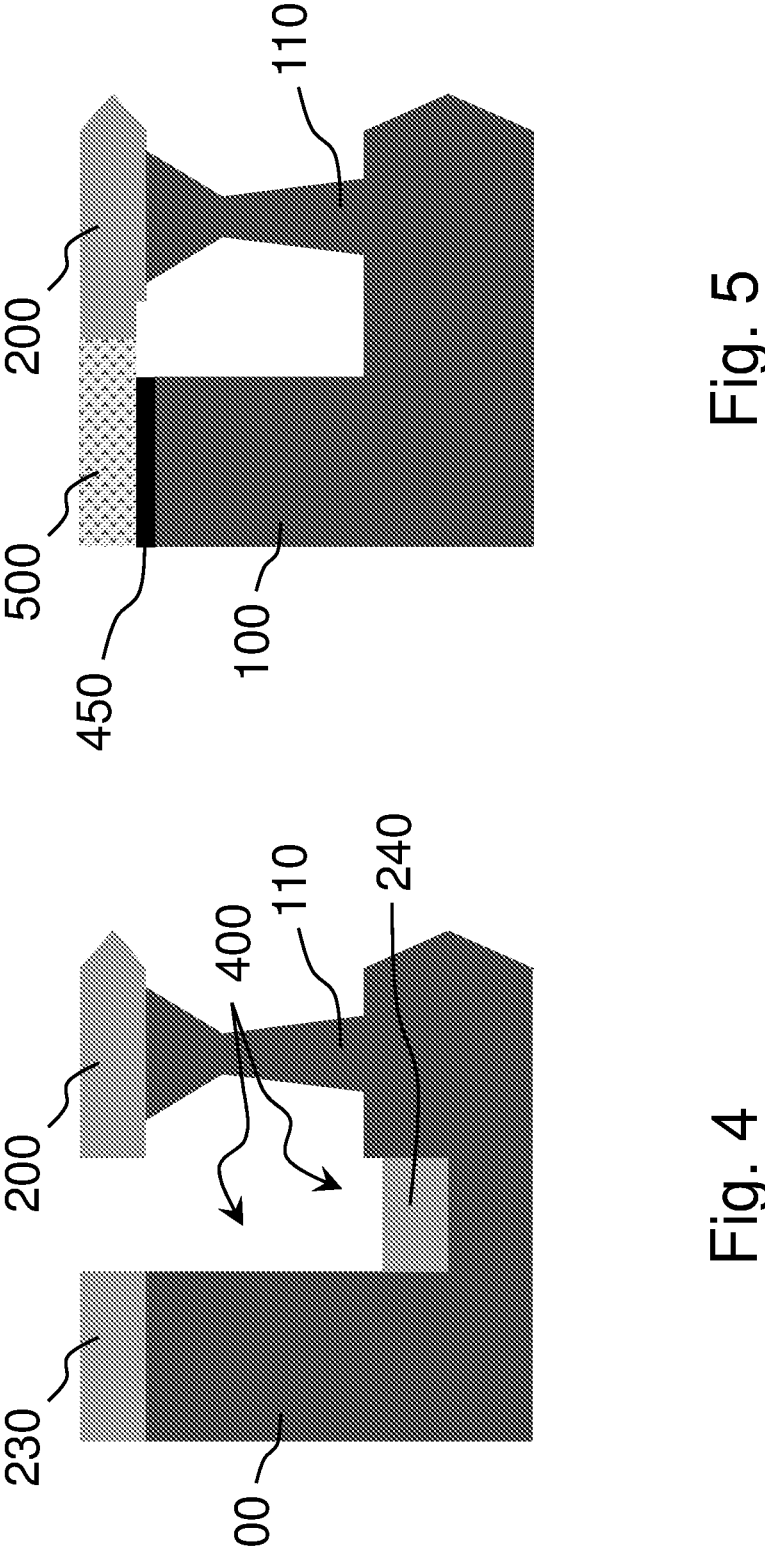
Figures 6, 7:
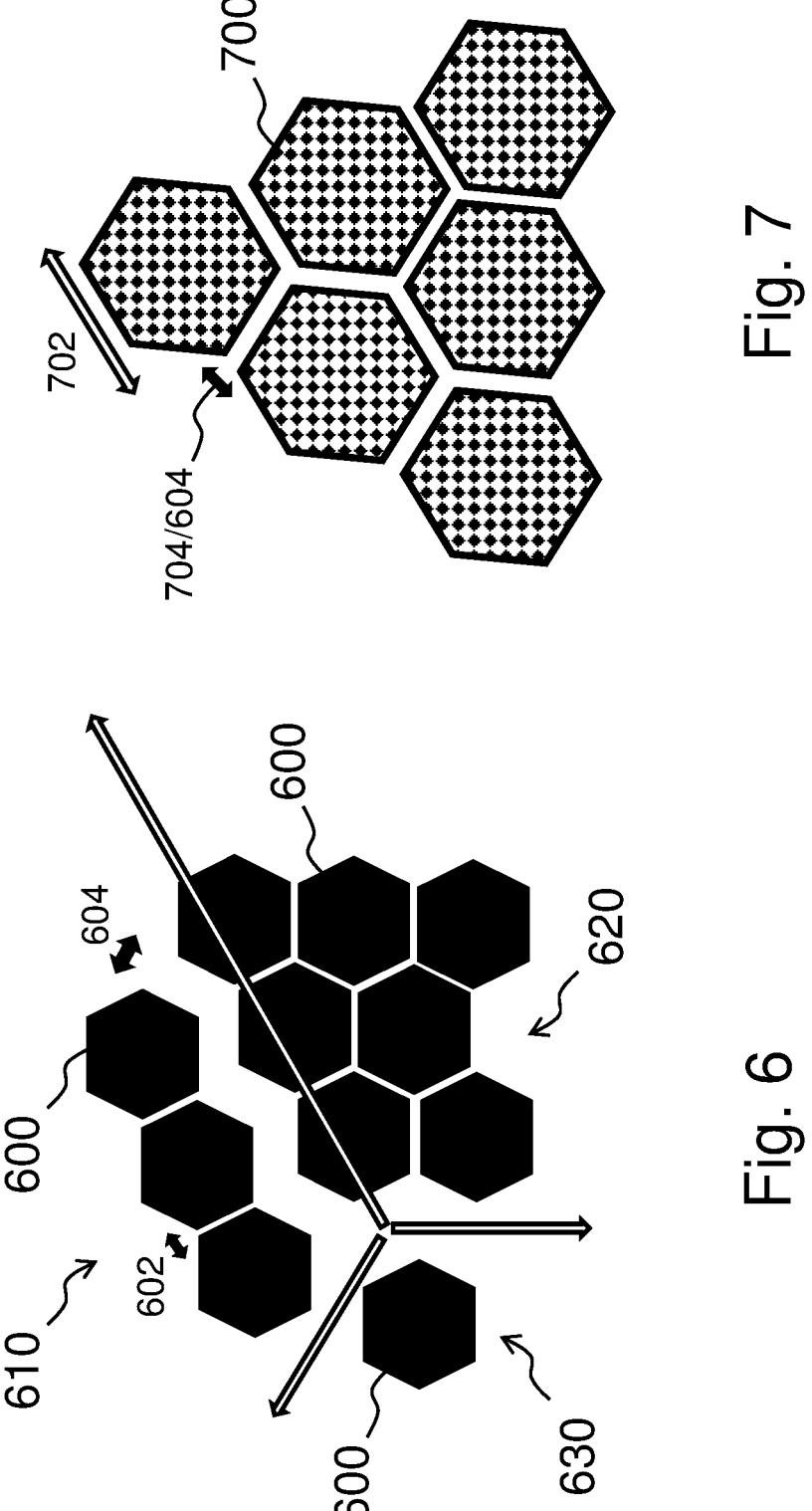
Figure 9:
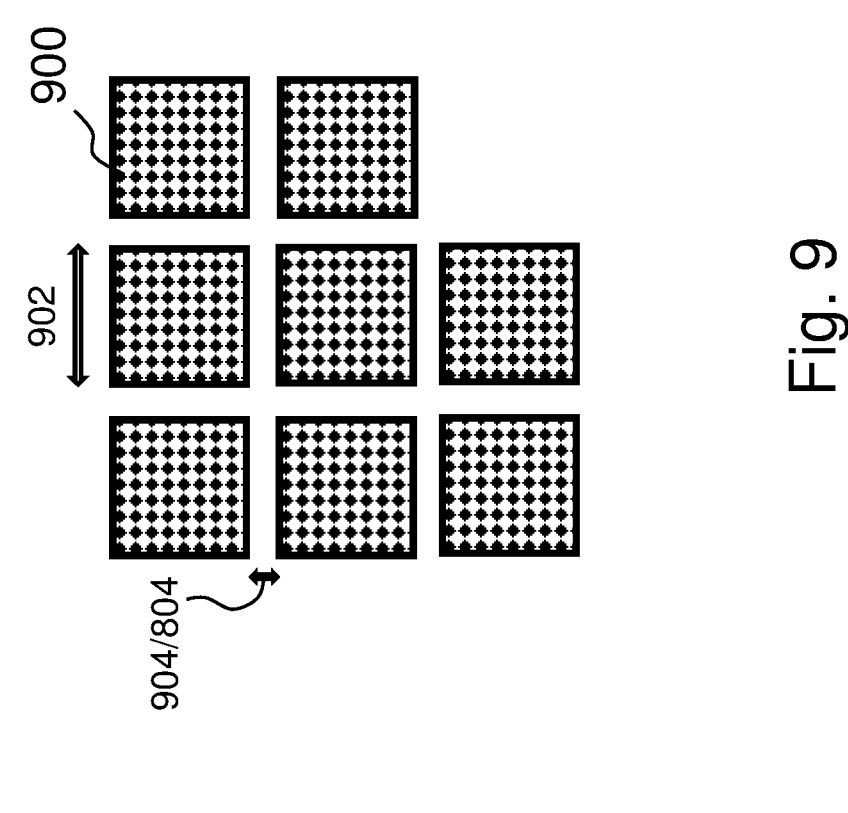
Figure 8:
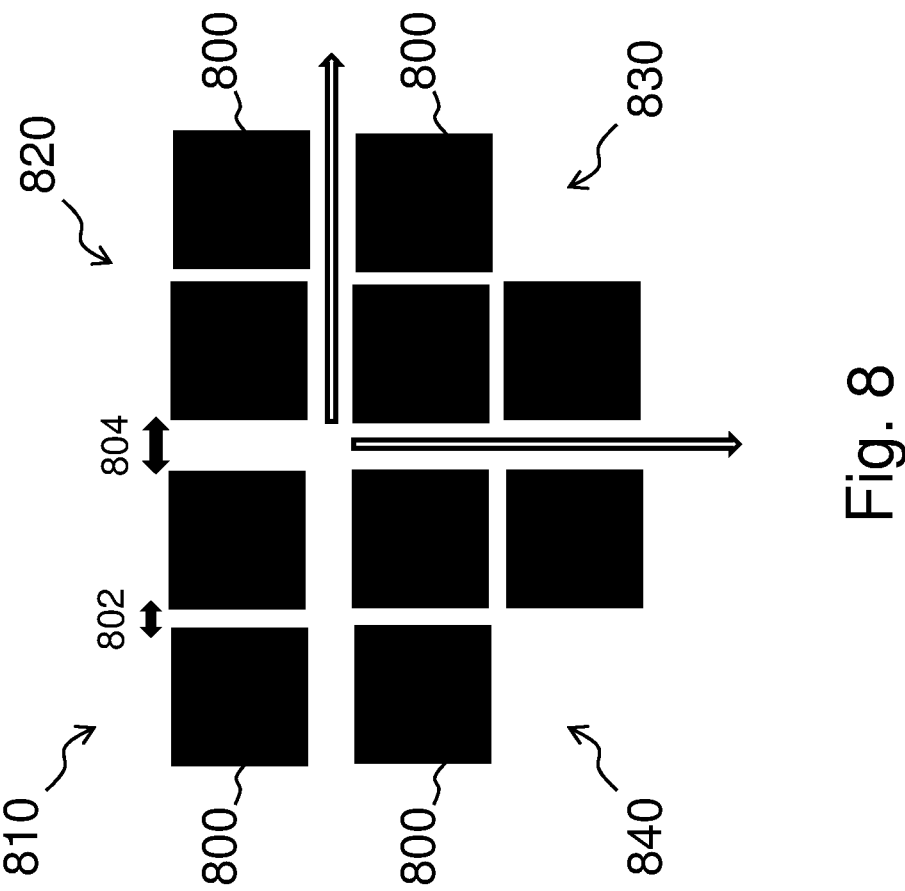

The present invention will be clearer from the following detailed description to be considered together with the annexed drawings, in which:

FIG. 1 show schematically a vertical cross-section of an embodiment of a structure according to the present invention before and after cooling, FIG. 2 show schematically a sequence of steps of an embodiment of a method according to the present invention, FIG. 3 shows schematically pillars of an embodiment of a structure produced according to the present invention, FIG. 4 shows schematically a cross-section of a first exemplary detail of an embodiment of a structure produced according to the present invention, FIG. 5 shows schematically a cross-section of a second exemplary detail of an embodiment of a structure produced according to the present invention, FIG. 6 shows schematically a top view of first exemplary seeds of an embodiment of a structure produced according to the present invention, FIG. 7 shows schematically a top view of first exemplary patches of an embodiment of a structure produced according to the present invention, FIG. 8 shows schematically a top view of second exemplary seeds of an embodiment of a structure produced according to the present invention, and FIG. 9 shows schematically a top view of second exemplary patches of an embodiment of a structure produced according to the present invention.

As can easily be understood, there are various ways to practically implement the present invention that is defined in its main advantageous aspects by the annexed claims and is not limited either by the following detailed description or by the annexed drawings.

DETAILED DESCRIPTION

A structure produced according to the present invention includes essentially a semiconductor substrate made (for example the substrate labelled 100 in FIG. 1 and FIG. 2) and a semiconductor epitaxial layer (for example the layer labelled 200 in FIG. 1 and FIG. 2) formed on top of the substrate through a high-temperature epitaxial growth process carried out in a reaction chamber of an epitaxial reactor.

The growth temperature depends on various elements, in particular the semiconductor materials, the precursor materials, the growth pressure, and the type of epitaxial reactor. For example and without any purpose of limitation for the present invention, monocrystalline silicon may be epitaxially grown on monocrystalline silicon at 1150° C. and 100 kPa, monocrystalline hexagonal silicon carbide may be epitaxially grown on monocrystalline hexagonal silicon carbide at 1650° C. and 10 kPa, and monocrystalline cubic silicon carbide may be epitaxially grown on monocrystalline silicon at 1370° C. and 13 kPa. Once the high-temperature epitaxial growth process is finished, the structure is extracted from the reaction chamber and cools down to e.g. room temperature (for example 20-30° C.).

A structure produced according to the present invention is typically subject to many other processing steps in addition to the high-temperature epitaxial growth process.

FIG. 1A shows schematically an embodiment of a structure according to the present invention before cooling inside a reaction chamber and FIG. 1B shows the same structure after cooling outside of the reaction chamber.

In FIG. 1, a substrate 100 made of e.g. silicon is patterned and a plurality of pillars 110 are formed, and an epitaxial layer 200 of e.g. silicon carbide is located on substrate 100 in particular on pillars 110; it is to be noted that both the substrate and the layer continue e.g. on the right and this is represented by the pointed shapes.

According to the embodiment of FIG. 1, pillars 110 are suitably shaped; there is a large top section 112 (adjacent to layer 200) and a small bottom section 114; the cross-section area of pillars 110 first reduces gradually moving from bottom section 114 to an intermediate section 116 and then increases gradually moving from the intermediate section 116 to top section 112; therefore, there is a necking 118 in pillars 110 at this intermediate section.

During the cooling phase, epitaxial layer 200 of silicon carbide shrinks more than substrate 100 of silicon due to the different CTEs (=Coefficient of Thermal Expansion) of the two materials; the white arrows in FIG. 1B represent the thermal stress internal to epitaxial layer 100. Due to such thermal stress inside layer 200, shear stress develops inside pillars 110. If pillars 110 are (sufficiently) thin, such thermal stress may lead to their breaking; in FIG. 1B, all pillars 110 have broken; it is to be noted that pillars 110 have broken at their necking 118, i.e. where their cross-section area is minimum. FIG. 1B shows that, after breaking, part of pillars 110 (namely their upper part) may remain joined to layer 200 and part of pillars 110 (namely their lower part) may remain integral with substrate 100.

If all pillars 110 are broken, layer 200 is completely free from substrate 100. If few pillars 110 are not broken and/or if any mechanical bond remains between substrate 100 and layer 200, a (small) force or a (small) torque may be applied to substrate 100 and/or layer 200 so to free layer 200 from substrate 100. At this stage, substrate 100 in FIG. 1B, including any part of pillars 110, may be disposed, and layer 200 in FIG. 1B, including any part of pillars 110, is a freestanding epitaxial layer (if its thickness is sufficiently high, for example 50-500 microns, preferably 150-300 microns) and may be used as a substrate for fabricating electric or electronic or optoelectronic components or as a substrate for further epitaxial growth.

It is to be noted that after separation of layer 200 from substrate 100, especially if the top of pillars 110 remain joined to layer 200, it may be advantageous to lap a back side of layer 200 so that the freestanding epitaxial layer is flat on both sides.

It is to be noted that according to the embodiment of FIG. 1, due to the cooling the epitaxial layer shrinks more than the substrate. However, alternatively according to the present invention, it may well be that the substrate shrinks more than the epitaxial layer. What happens depends on the CTEs of the material of the substrate and of the material of the layer.

A possible process that lead to the structure of FIG. 1A is described in the following with the help of FIG. 2.

The starting point of this process is a substrate 100 made of monocrystalline silicon as shown in FIG. 2A.

Substrate 100 is suitably masked in order to be etched; FIG. 2A shows substrate 100 with a number of mask elements 150 placed on top of its flat upper surface. Then, a first etching step is carried out and a number of deep and narrow vertical grooves 122 are created as shown in FIG. 2C; this may be called a "vertical" etching step. In this way, an array of vertical columns are formed in the upper portion of substrate 100. Such first etching step may carried out through a dry-etching process, for example a Bosch process or a Cryo process (well known to the experts).

Then, a second etching step is carried out and grooves 122 are enlarged a number of deep and shaped vertical grooves 124 are created as shown in FIG. 2D. In this way, the array of columns transforms into the array of pillars 110 laterally spaced from each other shown in FIG. 1A. Such second etching step may carried out through a an isotropic dry-etching process or a wet etching process (well known to the experts).

Then, mask elements 150 are removed from the top section of pillars 110 for example through a third etching step as shown in FIG. 2E leaving a flat and smooth "epi-ready" surface 119 on top of pillars 110; as known, "epi-ready" means ready for a subsequent epitaxy forming monocrystalline material. Such third etching step may carried out through a dry-etching process or a wet-etching process (well known to the experts) and may include surface oxidation and oxide wet-stripping.

At this stage, an epitaxial deposition process of silicon carbide is carried out at high temperature. For this purpose, the structure shown in FIG. 2E is introduced for example into a reaction chamber of an epitaxial reactor.

In the following, the epitaxial deposition process is divided in three successive deposition sub-steps for a simple exemplary explanation; however, this is not to be construed as a limitation of the present invention; in fact, as known to the experts, a real deposition step (corresponding to step B set out above) is quite complicated and evolves through a number of sub-steps. FIGS. 2F, 2G and 2H may correspond to different instants of the single deposition step B.

After a first deposition sub-step, a monocrystalline seed 210 of silicon carbide is formed on each surface 119 of pillars 110 as shown in FIG. 2F. Seeds 210 are laterally spaced from each other. During this first deposition, it may be assumed that the growth is mainly in the vertical direction.

After a second deposition sub-step, seeds 210 grow both vertically and laterally so that an array of adjacent seeds 220 of silicon carbide is formed as shown in FIG. 2G—merge of a plurality of seeds into a single patch is just started.

After a third deposition sub-step, the (suitably thick) layer 200 of silicon carbide is formed on pillars 110 as shown in FIG. 2H.

At this stage, the structure may be extracted from the reaction chamber of an epitaxial reactor; typically, the structure may still be relatively hot at the time of extraction.

In general, the method for producing a freestanding epitaxial layer according to the present invention is based on the use of two different semiconductor materials with different CTEs.

According to embodiments of the present invention, the substrate may belong for example to a first family (that allows an easy patterning) including Si, Ge or SiGe, or a second family including GaAs, GaP, ZnSe, ZnS, SiC, GaN, or a third family (i.e. oxides) ZnO, Al2O3, MgAlO4.

According to embodiments of the present invention, the epitaxial layer may include for example Si, Ge, GaN (hexagonal and cubic) and SiC (hexagonal and cunic) that are attractive as semiconductor materials for e.g. power electronics and/or optoelectronics.

In general, the method for producing a freestanding epitaxial layer according to the present invention comprises the steps of (non-limiting reference may be made to FIG. 1 and FIG. 2):

A) (see especially FIG. 2) patterning a substrate (100) of a first semiconductor material by an etching process so to form an array of pillars (110), the pillars (110) being suitably laterally spaced from each other and having a top section (112) larger than a bottom section (114) and/or intermediate sections (116), B) (see especially FIG. 2) depositing a second semiconductor material on top of the pillars (110) at a growth temperature so to form an epitaxial layer (200) generated by vertical and lateral growth of the second semiconductor material, and C) (see especially FIG. 1) inducing breaking of the pillars (110) by cooling the substrate (100) and the epitaxial layer (200) below the growth temperature. The top section of the pillars is preferably quite large so to be a good starting point for the following deposition; not only, the top section of the pillars should be such (in particular flat and smooth) that to allow the following growth of monocrystalline material. The bottom section and/or the intermediate sections are preferably quite narrow so to break relatively easily. More details on the shape and the sizes of the pillars will be provided afterwards; typically, pillars are identical or very similar.

How to control the proportion between vertical and lateral growth at step B is known to the person skilled in the art; typically, this is achieved by controlling the deposition conditions.

Step B may comprise one or two or more successive deposition steps.

Although, at step C, it may be typical to cool the structure down to room temperature, this is not strictly necessary. Other processing steps after step C may make it preferable to reduce temperature only down to e.g. 10-40% of the growth temperature provided that pillars (preferably all or most of pillars, for example more than 80-90%) are broken.

As it is already apparent from the description of the embodiment of FIG. 1 and FIG. 2, it is advantageous that the pillars are produced by a multi-step etching process of the substrate.

Such multi-step etching process may comprise at least two dry etching steps so to suitably shape the pillars, in particular so to form a necking (118 in FIG. 1) at an intermediate section of the pillars; the necking is arranged to break under thermal stress according to step C. Preferably, the necking is formed at a same (or about the same) depth from a top surface of the substrate so that pillars break at a same (or about the same) position.

Such multi-step etching process may comprise a wet etching step so to form an epi-ready surface (119 in FIG. 2) at the top section (112 in FIG. 1) of the pillars. The steps of the method according to the present invention are designed so that, typically, the epitaxial layer deposited at step B extends only in an area corresponding to the array of pillars. It is to be noted that, due for example to lateral growth, the area of the epitaxial layer may not correspond exactly to the area occupied by the array of pillars.

Reference will now be made to FIG. 3 wherein three pillars 300, corresponding to pillars 110 in FIG. 1 and FIG. 2. The shape of the transversal cross-section of the pillars will be considered afterwards; for the sake of simplicity, it is now assumed that it is circular.

A pillar 300 may be considered to have a "T-shape" geometry with a wide top 302 supported by a narrow stem 304; an intermediate section (116 in FIG. 1A) is located between top 302 and stem 304 and there is a necking in the pillars at this intermediate section; indeed, there is a plurality of intermediate sections 306 between the top section (112 in FIG. 1A) and the bottom section (114 in FIG. 1A). In particular, the cross-section area of stem 304 decreases gradually from the bottom to this intermediate section and the cross-section area of top 302 increases gradually from this intermediate section to the top.

A size 312 of the top section may be for example in the range from 3 microns to microns, preferably in the range from 5 microns to 10 microns.

A size 314 of a distance between top sections of two successive pillars may be for example in the range from 1 micron to 5 microns, preferably in the range from 1.5 microns to 3 microns.

A size 322 of the intermediate section at the necking may be for example in the range from 0.2 microns to 2 microns, preferably in the range from 0.7 microns to 1.5 microns.

A size 332 of the bottom section may be for example in the range from 1.5 microns to 5 microns, preferably in the range from 2 microns to 3.5 microns. A size 342 of a height of top 302 may be for example in the range from 1 micron to 10 microns, preferably in the range from 1.2 microns to 5 microns.

A size 344 of a height of stem 304 may be for example in the range from 7 micron to 30 microns, preferably in the range from 9 microns to 15 microns. Therefore, a height of a pillar may be for example in the range from 8 micron to 40 microns, preferably in the range from 10 microns to 20 microns.

Therefore, a distance 334 between vertical axes of two successive pillars may be for example in the range from 2.5 micron to 15 microns, preferably in the range from 4 microns to 8 microns.

The shape of the transversal cross-section of the pillars may be for example square (see for example FIG. 8), rectangular, pentagonal, hexagonal (see for example FIG. 6), circular or elliptical. Typically, a pillar maintains the same shape or approximately the same shape along its length but preferably varies its cross-section area.

In the above description, it has been assumed that the epitaxial layer is not bound (or substantially not bound) laterally so that when the pillars are broken the layer is free from the substrate.

According to a first possibility that may be better understood referring to FIG. 4, a trench (400 in FIG. 4) is formed in the substrate around the array of pillars (110 in FIG. 4) so that the epitaxial layer (200 in FIG. 4) is unbound laterally.

Typically, the trench is all around the array of pillars. For example, during step B, semiconductor material deposits non only on the pillars but also around the pillars (see reference 230 in FIG. 4) and inside the trench (see reference 240 in FIG. 4); however, due to the depth of the trench, void remain around the epitaxial layer (200 in FIG. 4).

According to a second possibility that may be better understood referring to FIG. 5, a frame (500 in FIG. 5) of a third material is formed on the substrate (100 In FIG. 5) around the array of pillars (110 in FIG. 5) so that the epitaxial layer (200 in FIG. 5) is loosely bound laterally to the frame (500 in FIG. 5). Typically, the frame is all around the array of pillars. If the material of the layer is monocrystalline silicon carbide, the material of the frame (different from the material of the layer) may be for example amorphous or polycrystalline silicon carbide. For example, during step B, semiconductor material deposits non only on the pillars but also around the pillars (see reference 500 in FIG. 4). According to the embodiment of FIG. 5, the deposited substance, for example silicon carbide, is the same but the material grown is different; this is due to for example to a layer 450 of for example silicon nitride or silicon oxide formed before the frame around the array of pillars.

FIG. 6 shows an embodiment wherein the shape of the transversal cross-section of the pillars is hexagonal; in particular, reference 600 corresponds to very thin (for example less than 1 micron) seeds (see e.g. FIG. 2F) on the pillars not yet merged together to form a patch or layer. A distance 602 between successive seeds may be in the range from 1 micron to 5 microns, preferably in the range from 1.5 microns to 3 microns.

FIG. 8 shows an embodiment wherein the shape of the transversal cross-section of the pillars is square; in particular, reference 800 corresponds to very thin (for example less than 1 micron) seeds (see e.g. FIG. 2F) on the pillars not yet merged together to form a patch or layer. A distance 802 between successive seeds may be in the range from 1 micron to 5 microns, preferably in the range from 1.5 microns to 3 microns.

The conceptual similarity between FIG. 6 and FIG. 8 is apparent.

FIG. 6 and FIG. 8 show embodiments wherein a set of distinct and separate arrays of pillars are formed in the substrate at step A so to form a corresponding set of epitaxial layer patches at step B (see respectively FIG. 7 wherein each patch is labelled 700 and FIG. 9 wherein each patch is labelled 900). FIG. 6 shows three sets of pillars 610, 620 and 630; they are laterally spaced more than the seeds; such distance 604 may be in the range from 3 microns to 10 microns, preferably in the range from 5 microns to 8 microns. FIG. 8 shows four sets of pillars 810, 820, 830 and 840; they are laterally spaced more than the seeds; such distance 804 may be in the range from 3 microns to 10 microns, preferably in the range from 5 microns to 8 microns. Much longer distances should not be excluded especially if these patches would be considered separate freestanding epitaxial layers.

Each of these patches (for example 700 in FIGS. 7 and 900 in FIG. 9) might be a freestanding epitaxial layer and might be used as a substrate for fabricating electric or electronic or optoelectronic components; in this case, their size should be relatively large, for example size 702 of patches 700 and size 902 of patches 900 may be in the range from 100 microns to 1000 microns (corresponding for example to the size of a single) electric or electronic or optoelectronic components. However, handling small patches may be difficult; therefore, the above-mentioned size may be increased for handling purposes.

The conceptual similarity between FIG. 7 and FIG. 9 is apparent.

Patches, for example patches 700 in FIG. 7 and patches 900 in FIG. 9, may be used as starting building blocks or starting points for forming larger epitaxial layers; in this case, their size should be relatively small, for example size 702 of patches 700 and size 902 of patches 900 may be smaller than some hundred microns.

In this case, a set of successive thin patches is formed through a first step B as shown in FIG. 7 and FIG. 9 (thickness of such patches may be relatively small, for example in the range of 5-50 microns, as they do not need to be "freestanding"); then a first step C may be used for breaking most of the pillars for each of the patches. Afterwards, a second step B is carried out in order to merge the patches and grow a thick (for example in the range of 50-500 microns, preferably 150-300 microns) and wide (for example in the range from 1.000 microns to 10.000 microns, but up to the size of approximately a whole wafer or for example approximately to ½ or ⅓ or ¼ or ⅕ of a whole wafer) freestanding epitaxial layer. Finally, a second step C may be used for breaking the residual pillars.

As already set out, a freestanding epitaxial layer may be formed through the present inventive method and arranged to be used as a substrate for fabricating electric or electronic or optoelectronic components or as a substrate for further epitaxial growth. Such layer may be considered a final product of the inventive method.

In general, the freestanding epitaxial layer may have any size up to almost the size of the starting disposable substrate (it must necessarily be slightly smaller) and any shape (in particular, circle or square).

It is to be noted that the present inventive method forms intermediate products for example if the method is stopped just after step A or just after step B or just after step C (especially if the epitaxial layer is not completely separated from the disposable substrate).

The invention claimed is:

1. Method for producing a freestanding epitaxial layer starting from a substrate that can be disposed,
    wherein the epitaxial layer is made of a first semiconductor material,
    wherein the substrate is made of a second semiconductor material,
    wherein the first semiconductor material is different from the second semiconductor material,
    wherein the CTE of the first semiconductor material is different from the CTE of the second semiconductor material,
    comprising the steps of:
    A) patterning said substrate by an etching process so to form an array of pillars, said pillars being laterally spaced from each other and having a top section larger than a bottom section or intermediate sections, the top section including a top surface,
    B) depositing said second semiconductor material so as to be in contact with the top surface of said pillars at a growth temperature so to form an epitaxial layer generated by vertical and lateral growth of said second semiconductor material, and
    C) inducing breaking of said pillars by cooling said substrate and said epitaxial layer below said growth temperature.

2. Method according to claim 1,
    wherein said pillars are produced by a multi-step etching process of said substrate.
3. Method according to claim 2,
    wherein said multi-step etching process comprises at least two dry etching steps so to form a necking at an intermediate section of said pillars, said necking being arranged to break under thermal stress according to step C.
4. Method according to claim 2,
    wherein said multi-step etching process comprises a wet etching step so to form an epi-ready surface at said top section.
5. Method according to claim 1, being such that said epitaxial layer extends only in an area corresponding to said array of pillars.
6. Method according to claim 1,
    wherein a trench is formed in said substrate around said array of pillars so that said epitaxial layer is unbound laterally.
7. Method according to claim 1,
    wherein a frame of a third material is formed on said substrate around said array of pillars so that said epitaxial layer is loosely bound laterally to said frame.
8. Method according to claim 1,
    wherein step B comprises two or more successive deposition steps.
9. Method according to claim 1,
    wherein a set of distinct and separate arrays of pillars are formed in said substrate at step A so to form a set of epitaxial layer patches at step B.
10. Method according to claim 9,
    wherein steps B and C are repeated so to merge said set of epitaxial layer patches and form a single freestanding epitaxial layer.
11. Method according to claim 1,
    comprising further the step of:
    D) applying a force or a torque so to free said epitaxial layer from said substrate after step C.
12. Method according to claim 1,
    comprising further the step of:
    E) lapping a back side of said epitaxial layer after step C or step D.
13. Method according to claim 2,
    wherein said multi-step etching process comprises at least two dry etching steps so to form a necking at an intermediate section of said pillars, at a same depth from a top surface of said substrate, said necking being arranged to break under thermal stress according to step C.
14. Method for producing a freestanding epitaxial layer starting from a substrate that can be disposed,
    wherein the epitaxial layer is made of a first semiconductor material,
    wherein the substrate is made of a second semiconductor material,
    wherein the first semiconductor material is different from the second semiconductor material,
    wherein the CTE of the first semiconductor material is different from the CTE of the second semiconductor material,
    comprising the steps of:
    A) patterning said substrate by an etching process so to form an array of pillars, said pillars being laterally spaced from each other and having a top section, a bottom section, and intermediate sections, wherein the intermediate sections are smaller than both the top sections and the bottom sections, B) depositing said second semiconductor material on top of said pillars at a growth temperature so to form an epitaxial layer generated by vertical and lateral growth of said second semiconductor material, and C) inducing breaking of said pillars by cooling said substrate and said epitaxial layer below said growth temperature.

\* \* \* \* \*